US008797157B2

(12) United States Patent
Haynes

(10) Patent No.: US 8,797,157 B2
(45) Date of Patent: Aug. 5, 2014

(54) SYSTEM AND METHOD FOR MONITORING USAGE AND PREDICTING FAILURE OF VISUAL NOTIFICATION APPLIANCES

(75) Inventor: John R. Haynes, Groton, MA (US)

(73) Assignee: Tyco Fire & Security GmbH, Neuhausen am Rheinfall (CH)

( * ) Notice: Subject to any disclaimer, the term of this patent is extended or adjusted under 35 U.S.C. 154(b) by 320 days.

(21) Appl. No.: 13/173,032

(22) Filed: Jun. 30, 2011

(65) Prior Publication Data

US 2013/0002424 A1 Jan. 3, 2013

(51) Int. Cl.

| | |
|---|---|
| ***G08B 21/00*** | (2006.01) |
| ***G08B 13/08*** | (2006.01) |
| ***G08B 13/18*** | (2006.01) |
| ***H03K 17/00*** | (2006.01) |
| ***G05B 23/02*** | (2006.01) |
| ***G08C 19/16*** | (2006.01) |
| ***G08B 25/00*** | (2006.01) |
| ***G08B 17/10*** | (2006.01) |
| ***G08B 5/00*** | (2006.01) |

(52) U.S. Cl.
USPC ......... 340/540; 340/545.3; 340/555; 340/2.4; 340/3.55; 340/12.1; 340/287; 340/628; 340/815.4; 340/641

(58) Field of Classification Search
CPC .................... G09G 2360/16; G09G 2320/048; G09G 3/2944; F21V 23/0442
See application file for complete search history.

(56) References Cited

U.S. PATENT DOCUMENTS

| | | | | | |
|---|---|---|---|---|---|
| 3,848,231 | A * | 11/1974 | Wootton | ........................ | 340/524 |
| 4,491,830 | A * | 1/1985 | Miyabe | .......................... | 340/584 |
| 4,670,739 | A * | 6/1987 | Kelly, Jr. | .................. | 340/539.17 |
| 4,920,549 | A * | 4/1990 | Dinovo | ............................ | 377/16 |
| 5,095,252 | A * | 3/1992 | Kurth | .......................... | 315/241 S |
| 5,736,930 | A * | 4/1998 | Cappels | ........................ | 340/642 |
| 6,448,715 | B1 * | 9/2002 | Fujiwara et al. | .............. | 315/129 |
| 7,498,949 | B2 * | 3/2009 | Ito et al. | ........................ | 340/628 |
| 7,538,687 | B2 * | 5/2009 | McKenna | ...................... | 340/902 |
| 8,111,131 | B2 * | 2/2012 | Zaveruha et al. | .............. | 340/3.1 |
| 2004/0000881 | A1 * | 1/2004 | Flory, IV | ...................... | 315/312 |

* cited by examiner

*Primary Examiner* — Daniel Wu
*Assistant Examiner* — Emily C Terrell
(74) *Attorney, Agent, or Firm* — Kacvinsky Daisak Bluni PLLC

(57) ABSTRACT

A system and method for monitoring usage and predicting failure of visual notification appliances are disclosed. The visual notification appliances may be strobe lights, which can be provided with an internal counter circuit that obtains a cumulative tally of the number of times the strobe has flashed. Since strobe service life is directly proportional to the number of flashes, monitoring the number of flashes enables proactive repair or replacement of the strobe prior to failure. Flash counts can be stored in the appliance and periodically transmitted to a remote location such as a fire panel or remote monitoring center. Flash counts can also be locally displayed, or can be readable by a user with a handheld device. Alarms or other indications may automatically be generated to alert building or service personnel when an end of life condition is approaching for one or more strobes. Other embodiments are disclosed and claimed.

25 Claims, 3 Drawing Sheets

SYSTEM AND METHOD FOR MONITORING USAGE AND PREDICTING FAILURE OF VISUAL NOTIFICATION APPLIANCES

FIELD OF THE DISCLOSURE

This invention relates generally to systems and methods for providing emergency notifications in buildings, and more particularly to a system and method for monitoring usage, and predicting failure, of emergency visual notification appliances.

BACKGROUND OF THE DISCLOSURE

Visual notification appliances are often used within buildings in conjunction with audio warning alarms so that the hearing impaired can be alerted to emergency conditions such as a fire. Typically, these appliances consist of flashing light strobes positioned throughout the building to provide a visual alarm indication, with a number of audible alarms and strobes often being connected in a network.

Often, failure of such strobe lights occurs without warning, so that repair or replacement is performed only after a failure has occurred. Unfortunately, such failure may occur during an emergency, when the strobe light should be functioning.

Because the expected life of a strobe is proportional to the cumulative number of cycles that it operates, it should be possible to predict failure so that repair or replacement can occur in a manner that minimizes the chances for light failure during an emergency. Currently, however, there is no practical method for tracking the number of times an individual strobe flashes after it has been installed. If such a method existed, it would be possible to predict when the strobe is approaching an end-of-life failure, which would enable proactive repair/replacement.

It would be desirable, therefore, to provide an automated system for monitoring the number of cycles to which a visual notification appliance has been subjected. The system should provide enable proactive service or replacement to occur prior to appliance failure. The system should also provide proof that the appliances had been operated for regular fire drills and system tests.

SUMMARY

Many notification appliances are non-addressable, which makes it difficult to track performance of an individual appliance directly on a notification circuit. With an addressable appliance, however, it is practical to transmit performance information from an individual appliance back to the fire control panel or remote service location. In either case, because the expected life of a strobe light is proportional to the cumulative number of operational cycles (i.e., flashes), providing a counter in the appliance electronics can provide a means for predicting appliance failure.

For addressable appliances, a simple counting circuit may be included for tracking the cumulative number of flashes of the appliance. An electronic register in the appliance captures the cumulative count and is readable by the fire control panel, which would also know from which appliance the count applies due to its unique address. The cumulative number of flashes can be monitored by the fire panel and/or by a remote monitoring center and can be used to trigger a warning to the building owner or service provider to indicating an predicted imminent or upcoming failure of the appliance.

The system may include an addressable notification appliance containing self-diagnostic sensors and circuitry, and which has a unique address that can be associated with a particular physical location in a building. The circuitry in the appliance can include an electronic counter that registers the cumulative number of duty-cycles of the strobe. A compatible fire alarm panel may also be provided, which is capable of polling the addressable notification appliances for cumulative usage information amassed in each appliance.

A means of reading and/or recording the number of duty cycles for each appliance may be connected to the fire panel. In one embodiment, a panel display or a service tool is provided. In another embodiment, the reading/recording functionality is provided at a remote service location.

For non-addressable appliances, an electronic counter may be implemented in the appliance circuitry. The contents of the counter may then be transmitted to a portable test and inspection tool, where the count could be displayed. Alternatively, the count could be displayed on a visual display contained in the appliance.

In addition, the system may include a means for communicating a "trouble"condition at the fire alarm panel when an appliance exceeds a specified cumulative number of duty cycles. A visual notification appliance is disclosed, comprising a strobe light, a counter for storing a number of times said strobe light has flashed, and a display for providing an alert to a user when a predetermined number of flashes has occurred.

A visual notification appliance is disclosed, comprising a light source, an interface for receiving a command to flash the light source, an electronic counter for storing a number of times the light source has flashed during a time interval, and means for reporting a message representative of the stored number of times the light source has flashed.

A method is disclosed for monitoring usage of a visual notification appliance. The method includes registering a count each time an associated light source flashes, obtaining cumulative count information for said light source based on said registered counts, comparing said cumulative count information to a predetermined count limit, and providing an alert when said cumulative count information exceeds the predetermined count limit.

A system is disclosed for monitoring usage of a visual notification appliance. The system includes a visual notification appliance configured to register a count each time an associated light source flashes, and to obtain cumulative count information based on said registered counts. The system also includes a receiver configured to compare said cumulative count information to a predetermined count limit and provide an alert when said cumulative count information exceeds the predetermined count limit.

BRIEF DESCRIPTION OF THE DRAWINGS

By way of example, a specific embodiment of the disclosed system will now be described, with reference to the accompanying drawings, in which.

DETAILED DESCRIPTION

Figure 1:
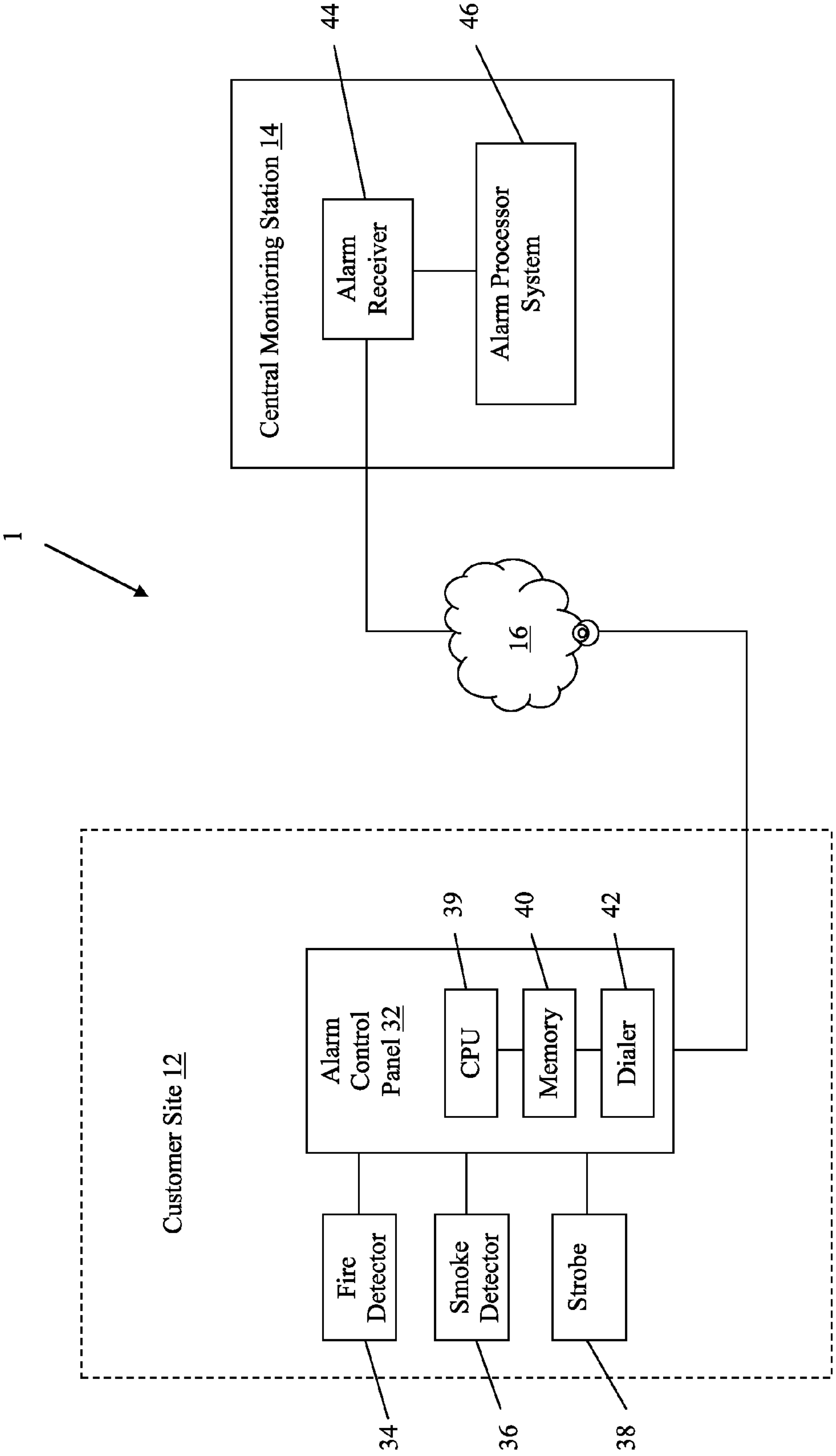
FIG. 1 is a schematic illustration of an exemplary building alarm system.

Referring now to FIG. 1, an exemplary alarm monitoring system 1 generally comprises one or more protected premises 12 and a central monitoring station 14 connected to a telecommunications network. A communication link 16 enables communication between an alarm control panel 32 at the protected premises 12 and an alarm receiver 44 at the central monitoring station 14. The communication link 16 can be a PSTN (Public Switched Telephone Network), a cellular network such as, for example, a GSM (Global System for Mobile Communications) network for SMS and packet voice communication, General Packet Radio Service (GPRS) network for packet data and voice communication, or a data network such as, for example, Ethernet/Internet for TCP/IP, VOIP communication, etc.

The protected premises 12 includes an alarm control panel 32 connected to one or more appliances and/or devices 34, 36, 38. The appliances/devices 34, 36, 38 may be any of a variety of sensors and alarms configured to detect events such as fire at the protected premises 12, and to provide alarm notifications in response to commands from the alarm control panel 32 and/or the central monitoring station 14. In the illustrated embodiment, the appliances/devices comprise a fire detector 34, a smoke detector 36 and a visual notification appliance (i.e., a strobe light) 38.

The alarm control panel 32 can collect alarm events from the detector devices 34, 36 and format alarm messages for transmission to the central monitoring station 14. Alarm message formats can be any of several well-known formats or protocols, including, but not limited to, Security Industry Association (SIA), 3X1, 4X2, Contact ID or per point ID (CID), and binary frequency shift key (BFSK).

The alarm control panel 32 can include a processor 39, memory 40 and a communication port 42. The memory 40 may contain program instructions executed by the processor to perform alarm control panel functions includ alarm collection and message formatting. The communication port 42 functions as an alarm communicator to dial a preprogrammed telephone number to access the central monitoring station 14 and transmit formatted alarm messages. In one embodiment, the alarm control panel does not include a communication port 42, but instead includes adigital alarm communicator transmitter (DACT) that performs the communication port function.

The central monitoring station 14 can include an alarm receiver 44 and an alarm processor system 46. The alarm receiver 44 can include a hard wired or wireless modem coupled to communication link 16. Alarm messages are received by the station receiver 44 from the protected premises 12 and passed to the alarm processor system 46 for processing and response.

Figure 2:
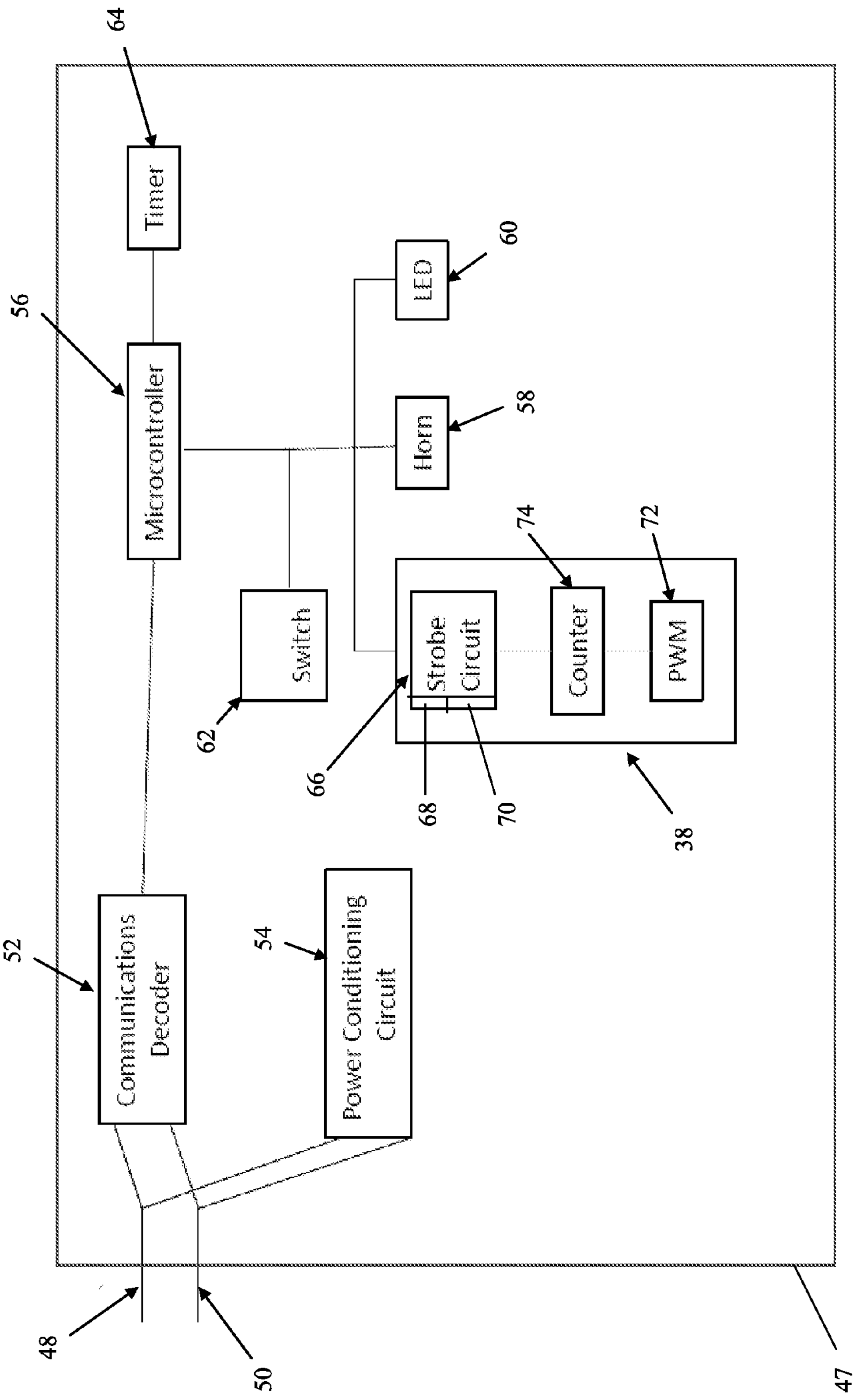
FIG. 2 is a schematic of an exemplary visual notification appliance.

FIG. 2 shows an exemplary notification appliance 47. Lines 48 and 50 provide electrical power to the notification appliance 47. As will be described, the notification appliance 47 may include both audible (i.e., horn) and visual (i.e., strobe) notification features. It will be appreciated, however, that notification appliance 47 may include only a visual notification feature.

The notification appliance 47 may include a communications decoder 52 and a power conditioning unit 54. Line 48, 50 are coupled to the communications decoder 52 and a power conditioning unit 54 to provide power to the appliance. The communications decoder 52 may interpret commands or polls received from a system controller, which in one embodiment is alarm control panel 32. A microcontroller 56 is coupled to the decoder 52, and controls operation of the visible notification appliance (strobe 38) in response to commands issued by the alarm control panel 32. The microcontroller 56 may also control operation an audible notification appliance 58, such as a horn, and an indicator LED 60.

The notification appliance 47 may further include a switch 62 for enabling individual notification appliances to be tested. A timer 64 may be connected to the microcontroller 56 to control the actuation/firing of the visual and/or audible alarms of the respective notification appliance.

Strobe 38 can include a strobe circuit 66 which includes a charging circuit 68 and a firing circuit 70. The charging circuit 68 is powered by the power lines 48, 50 which apply a series of current pulses to a capacitor to charge the capacitor. Accordingly, a pulse width modulator (PWM) 72 is provided in strobe 38 to control the charging circuit 68. The firing circuit 70 responds to a change in voltage across the power lines 48, 50 to discharge the capacitor through the strobe 38.

A counter 74 is provided to track the cumulative number of times that the strobe 38 is fired. Counter 74 can be provided within the strobe circuit 66 or the microcontroller 56. In one embodiment, the counter 74 comprises a register circuit, and increments in value each time the capacitor of the charging circuit 68 discharges. It will be appreciated that this is an exemplary implementation of a counter, and that other counting arrangements may also be used. For example, a non-volatile electro-mechanical counter could be used, as could a mechanical dial or gearing that is physically advanced in proportion to cumulative usage cycles. Alternatively, a variable resistor whose resistance increases or decreases in proportion to the cumulative cycles could also be used.

Where the notification appliance 47 is an "addressable" appliance (i.e., it contains a unique IP address on the network), the appliance 47 can communicate with the alarm control panel 32 and/or the central monitoring station 14 using its address.

In this way, the alarm control panel 32 and/or the central monitoring station 14 can collect cumulative usage information for each strobe 38 at the protected premises 12.

In one embodiment, count information from the counter 74 may be sent to the alarm control panel 32 and/or the central monitoring station 14 by the microcontroller 56. Count information can be sent periodically, or it may be sent when a particular threshold count has been reached. Alternatively, the alarm control panel 32 and/or the central monitoring station 14 may poll the notification appliance 47 to obtain count information. Such polling can occur on a periodic basis, or any other basis as desired.

The alarm control panel 32 and/or the central monitoring station 14 may store cumulative count information for individual strobes 38. An alert may be provided when the count information for a particular strobe 38 meets or exceeds a predetermined threshold value. An alert can be in the form of a "trouble" condition on the panel (i.e., a red blinking light on the panel user interface). Alternatively, it could be an email or electronic message that is sent from the panel 32 to a central station monitoring station 14. The alert could also be in the form of a flashing led indicator on the notification appliance.

The predetermined threshold value may correspond to an expected end of service life for the associated strobe. Alternatively, the predetermined threshold may correspond to a predetermined percentage of an expected life of the associated strobe. In one example, an alert may be triggered when the flash count for a particular strobe 38 reaches 90% of the expected total number of lifetime flashes for the strobe type. It will be appreciated that any of a variety of other percentages can be used as the alert threshold (e.g., 95%, 99%). In addition, multiple triggered alerts can be provided (e.g., 90%, 95% and 99%.)

In some embodiments, the notification appliance 47 is not an "addressable"appliance. Such arrangements may employ a series of notification appliances 47 in a loop configuration such that all appliances are activated simultaneously when an alarm condition is sensed. For non-addressable notification appliances, cumulative count information may be obtained using a local service tool such as a hand-held device carried by a service technician. Such hand-held devices may obtain information from the notification appliance 47 using radio-frequency (RF) or radio frequency identification (RFID). Alternatively, the hand-held device could include a magnetic probe that triggers a coded visual or audible pulse from the notification appliance that is representative of a number of cumulative cycles. This locally-collected information could then be used to determine if an end of service life condition is being approached for an individual strobe 38.

Alternatively, for non-addressable notification appliances, a local display may be provided that would display a cumulative count of the number of times the associated strobe 38 has flashed. The display could be a liquid crystal display (LCD), light emitting diode (LED), or other appropriate display. Examples of such alternative displays include electro-mechanical (i.e., pop-up) display that is triggered by a predetermined cycle count. Alternatively, an electro-mechanical dial gauge could be used, in which needle position is proportional to cycle count.

In one embodiment, the counter 74 can begin counting at a first use of the strobe 38, and would include any factory testing that occurs prior to shipment. The counter could always maintain the total cumulative count. Alternative counting functions are also contemplated. For example, one counting function might be the number of flashes since the most recent test or inspection of the notification appliance 47. In another embodiment, an audible or visual display may be provided when a predetermined number of counts has been met or exceeded.

Figure 3:
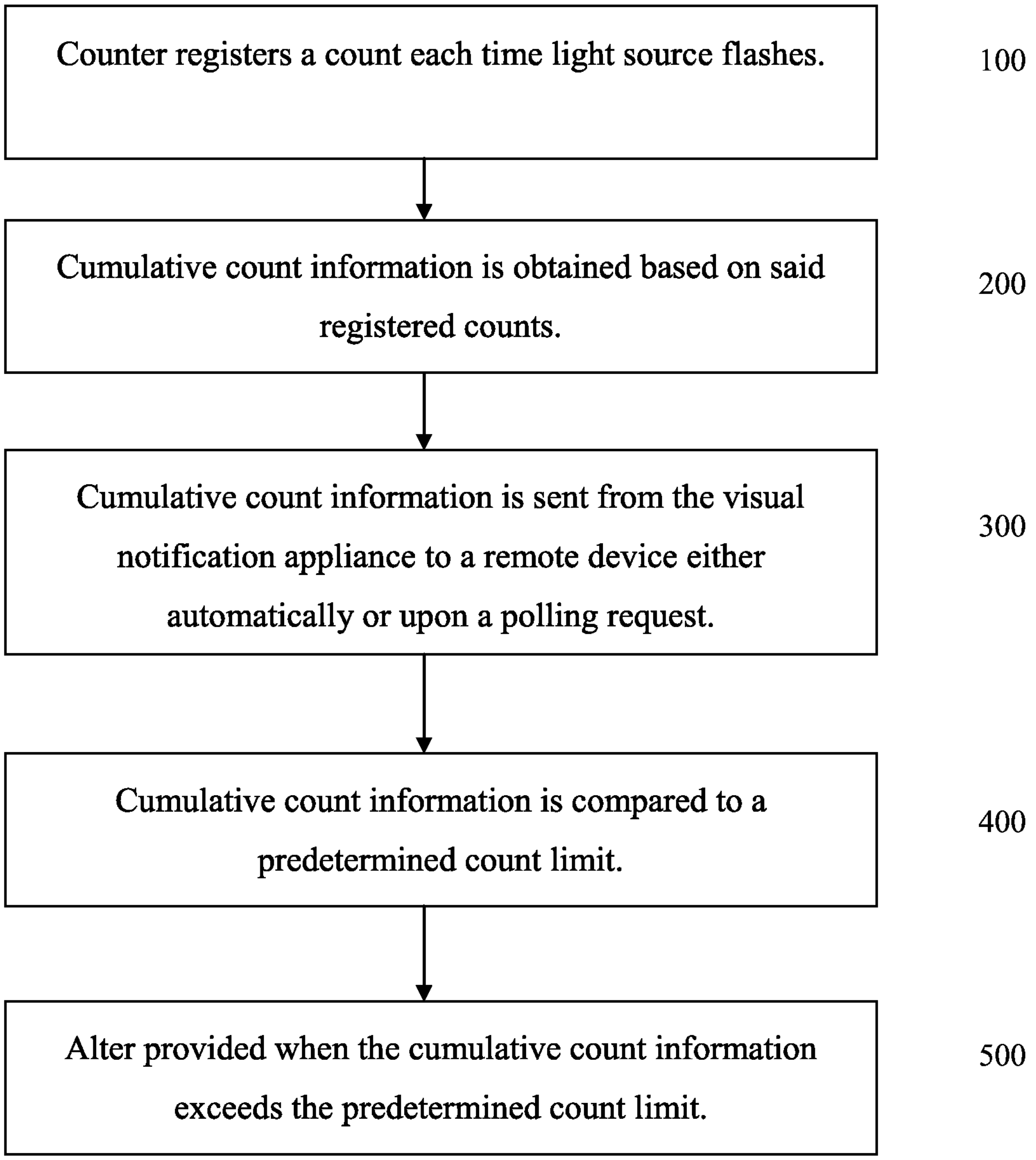
FIG. 3 is a method of operating the system of FIG. 1.

FIG. 3 illustrates an exemplary method for monitoring usage of a visual notification appliance 47, and for predicting an end of life of a visual notification appliance. At step 100, a counter registers a count each time an associated light source flashes. At step 200, cumulative count information for said light source is obtained, based on said registered counts. At step 300, cumulative count information is sent from the visual notification appliance to a remote device either automatically or upon a polling request. At step 400, said cumulative count information is compared to a predetermined count limit. At step 500, an alert is provided when said cumulative count information exceeds the predetermined count limit. In one embodiment, the predetermined count limit corresponds to an end of service life for the light source.

Some embodiments of the disclosed system may be implemented, for example, using a storage medium, a computer-readable medium or an article of manufacture which may store an instruction or a set of instructions that, if executed by a machine, may cause the machine to perform a method and/or operations in accordance with embodiments of the disclosure. Such a machine may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory (including non-transitory memory), removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto

The invention claimed is:

1. A visual notification appliance, comprising:
a strobe light;
a counter that stores a value indicative of a number of times said strobe light has flashed;
a display for providing occurred visual indication based on the stored value and a predetermined threshold; and
a network connection for transmitting said number of times said light source has flashed to a remote device over a network,
wherein said visual notification appliance contains a unique address on the network.

2. The visual notification appliance of claim 1, wherein the counter comprises a register.

3. The visual notification appliance of claim 1, wherein the remote device comprises a fire alarm panel.

4. The visual notification appliance of claim 1, wherein the remote device comprises a central monitoring station.

5. The visual notification appliance of claim 1, wherein the remote device comprises a hand-held device.

6. The visual notification appliance of claim 1, further comprising a display for displaying a number of times said light source has flashed.

7. The visual notification appliance of claim 1, wherein the visual indication indicates that a predetermined number of flashes has occurred.

8. The visual notification appliance of claim 1, wherein the number of times said strobe light has flashed is one of: absolute; measured relative to an occurrence of an event; and measured relative to a time period.

9. A visual notification appliance, comprising:
a light source;
an interface for receiving a command to flash the light source;
an electronic counter that stores a value indicative of a number of times the light source has flashed during a time interval; and
means for reporting a message representative of the stored number of times the light source has flashed,
wherein the means for reporting transmits the stored number of times the light source has flashed to a remote device over a network connection using a unique address corresponding to the visual notification appliance.

10. The visual notification appliance of claim 9, wherein the time interval begins when the light source is first flashed.

11. The visual notification appliance of claim 9, wherein the remote device is a fire alarm control panel.

12. The visual notification appliance of claim 9, wherein the remote device is a hand-held receiver.

13. The visual notification appliance of claim 9, wherein said message is transmitted via a network interface.

14. The visual notification appliance of claim 9, wherein said message is transmitted via a wireless connection.

15. The visual notification appliance of claim 9, wherein said means for reporting sends an indication that the stored number of times the light source has flashed exceeds a predetermined threshold.

16. The visual notification appliance of claim 15, wherein said predetermined threshold is representative of an expected end-of-life failure of the appliance.

17. A method for monitoring usage of a visual notification appliance, comprising:

registering a count each time an associated light source flashes;

obtaining cumulative count information for said light source based on said registered counts;

comparing said cumulative count information to a predetermined count limit;

sending said cumulative count information from said visual notification appliance to a remote device over a network via a network connection; and providing an alert when said cumulative count information exceeds the predetermined count limit, wherein said visual notification appliance contains a unique address on the network.

18. The method of claim 17, wherein the predetermined count limit corresponds to an end of service life for the light source.

19. The method of claim 17, wherein the remote device is a fire alarm control panel.

20. A system for monitoring usage of a visual notification appliance, comprising:

a visual notification appliance configured to register a count each time an associated light source flashes, and to obtain cumulative count information based on said registered counts; and a receiver configured to compare said cumulative count information to a predetermined count limit and provide an alert when said cumulative count information exceeds the predetermined count limit, wherein the visual notification appliance is configured to transmit said cumulative count information to a remote device over a network via a network connection, wherein said visual notification appliance contains a unique address on the network.

21. The system of claim 20, wherein the predetermined count limit corresponds to an end of service life for the light source.

22. The visual notification appliance of claim 1, wherein said network connection is configured to connect to a public switched telephone network, a cellular network, a general packet radio service network, or a TCP/IP network.

23. The visual notification appliance of claim 9, wherein said network connection is configured to connect to a public switched telephone network, a cellular network, a general packet radio service network, or a TCP/IP network.

24. The method of claim 17, wherein said network connection is configured to connect to a public switched telephone network, a cellular network, a general packet radio service network, or a TCP/IP network.

25. The system of claim 20, wherein said network connection is configured to connect to a public switched telephone network, a cellular network, a general packet radio service network, or a TCP/IP network.

* * * * *